United States Patent [19]

Miura et al.

[11] Patent Number: 5,410,207
[45] Date of Patent: Apr. 25, 1995

[54] PIEZOELECTRIC ACTUATOR

[75] Inventors: Shinsuke Miura, Tokyo; Tsutomu Odagiri, Chiba, both of Japan

[73] Assignee: Yamaichi Electronics Co., Ltd., Tokyo, Japan

[21] Appl. No.: 155,853

[22] Filed: Nov. 23, 1993

[30] Foreign Application Priority Data

Nov. 26, 1992 [JP] Japan ............... 4-341531

[51] Int. Cl.⁶ ............................ H01L 41/08
[52] U.S. Cl. ............................ 310/328
[58] Field of Search ................ 310/328

[56] References Cited

U.S. PATENT DOCUMENTS

| | | | |
|---|---|---|---|
| 4,446,469 | 5/1984 | Perna | 310/328 |
| 4,510,412 | 1/1985 | Suda et al. | 310/328 |
| 4,570,095 | 2/1986 | Uchikawa | 310/328 |
| 4,976,553 | 12/1990 | Yamaguchi et al. | 310/328 |
| 5,173,605 | 12/1992 | Hayes et al. | 310/328 |

FOREIGN PATENT DOCUMENTS

| | | | |
|---|---|---|---|
| 3626507 | 2/1987 | Germany | 310/328 |
| 0113673 | 6/1985 | Japan | 310/328 |
| 0174811 | 7/1987 | Japan | 310/328 |
| 0187912 | 8/1987 | Japan | 310/328 |

*Primary Examiner*—Thomas M. Dougherty
*Attorney, Agent, or Firm*—Wenderoth, Lind & Ponack

[57] ABSTRACT

A piezoelectric actuator has a zigzag-shaped actuator body, and an expansible piezoelectric element attached to the actuator body. The actuator body has zigzag elements. The zigzag elements are shifted toward and away from each other by expansion/contraction of the expansible piezoelectric elements. The actuator body is expanded and contracted by positional shifting of the zigzag elements.

8 Claims, 4 Drawing Sheets

PIEZOELECTRIC ACTUATOR

BACKGROUND OF THE INVENTION

1. Field of the Invention

This invention relates to a piezoelectric actuator in which expansible piezoelectric elements formed of, for example, piezoelectric ceramic or the like are employed. The piezoelectric actuator of this type is used as a vibration source, for example, in a vibrator, or as a device for controlling an object to be in an upper limit position and a lower limit position.

2. Prior Art

Heretofore, a piezoelectric actuator of this type has employed a structure in which expansible piezoelectric ceramics are laminated in multilayers, and the respective piezoelectric ceramics are expanded/contracted by voltage supplied thereto, so that such expansions/contractions are accumulated to expand or contract the whole multilayer structure in the laminating direction.

In the above piezoelectric actuator, the expanding amount of the whole actuator is obtained by an increase in width dimension when each piezoelectric ceramic is contracted. However, since the increase in width dimension due to contraction of each piezoelectric ceramic is very small, a sufficient amount of expansion of the whole actuator is difficult to obtain.

SUMMARY OF THE INVENTION

It is therefore an object of the present invention to provide a piezoelectric actuator in which an amount of expanding/contracting motion can be extensively increased.

To achieve the above object, there is essentially provided a piezoelectric actuator comprising a zigzag-shaped actuator body, and an expansible piezoelectric element attached to the actuator body. The actuator body includes zigzag elements, and the zigzag elements is shifted toward and away from each other by expansion/contraction of the expansible piezoelectric element. The actuator body is expanded and contracted by positional shifting of the zigzag elements.

The zigzag structure of the actuator body in cooperation with the expansible piezoelectric elements attached thereto allows for a considerable increase in the shifting amount of each zigzag element, and by accumulating the shifting amount of each zigzag element, there can be obtained a sufficiently amplified expanding/contracting amount of the whole actuator assembly.

By arranging a pair of such actuators in axially symmetrical relation to each other, the object supported thereon can be horizontally moved in parallel with a sufficient amount of motion.

The features of the present invention will become more manifest to those skilled in the art upon a reading of the detailed description taken in conjunction with the accompanying drawings, which are incorporated in and constitute a part of the disclosure.

DETAILED DESCRIPTION OF THE DRAWINGS

Figure 1:
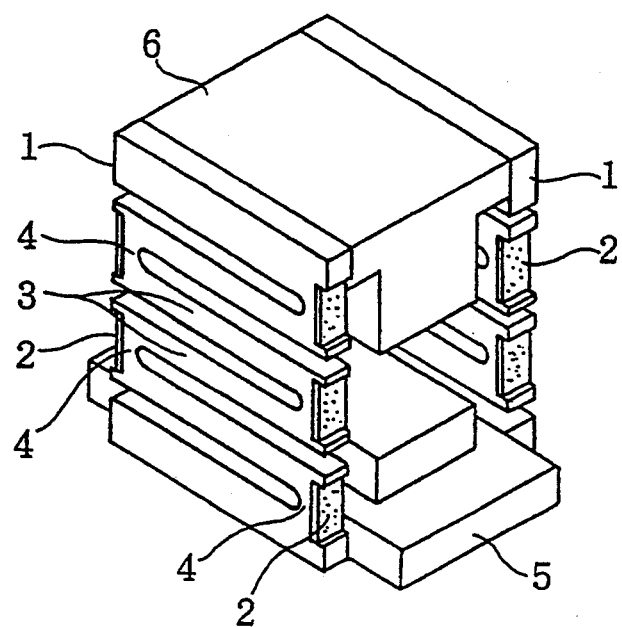
FIG. 1 is a perspective view of piezoelectric actuators according to a first embodiment of the present invention.
Figure 2:
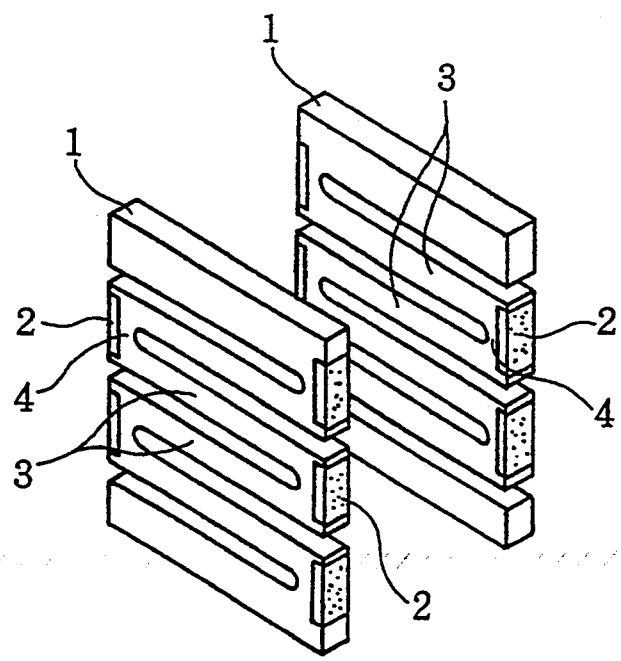
FIG. 2 is a perspective view showing a state wherein the piezoelectric actuators are disposed in axially symmetrical relation to each other.

FIGS. 1 to 4 show a first embodiment of the present invention, and FIGS. 5 to 8 show a second embodiment thereof. First, a construction common to both of the embodiments will be described, and then constructions to the respective embodiments will be described.

In the first and second embodiments, reference numeral 1 denotes an actuator body of a zigzag construction, and reference numeral 2 denotes expansible piezoelectric elements. This zigzag assembly includes a plurality of zigzag elements 3 extending laterally and connected to each other such that one end of a first zigzag element 3 is connected to a proximal end of a second zigzag element 3 whose distal end is, in turn, connected to a proximal end of a third zigzag element 3, and so on. The adjacent two zigzag elements 3 are capable of being positionally shifted toward and away from each other with a connection section 4 serving as a starting point. The whole zigzag assembly is elastically vertically expansible.

In the first embodiment, each connection section 4 between the adjacent zigzag elements 3 is attached with the expansible piezoelectric element 2. The expansible piezoelectric element 2 is formed of piezoelectric ceramic, or the like. The piezoelectric element 2 is expanded and contracted by supplying voltage to electrode layers formed on each of the front and rear surfaces thereof.

Figure 3:
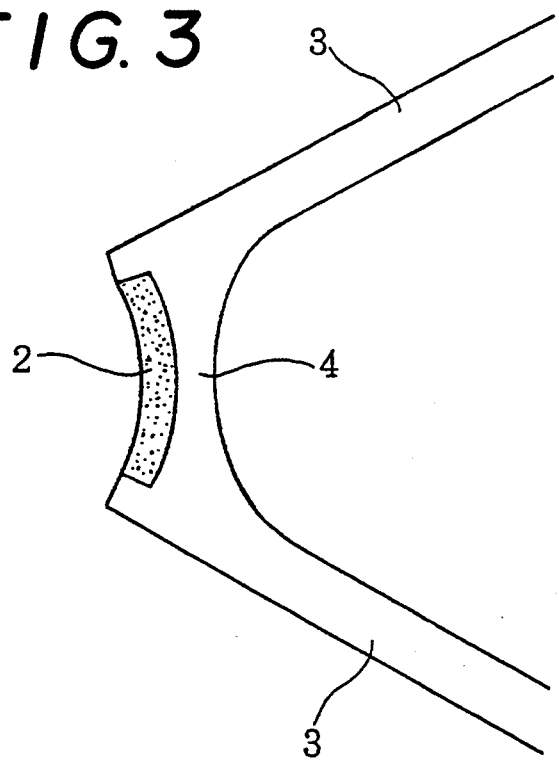
FIG. 3 is an enlarged side view showing an operating condition of the actuator when expansible piezoelectric element pieces are contracted.
Figure 4:
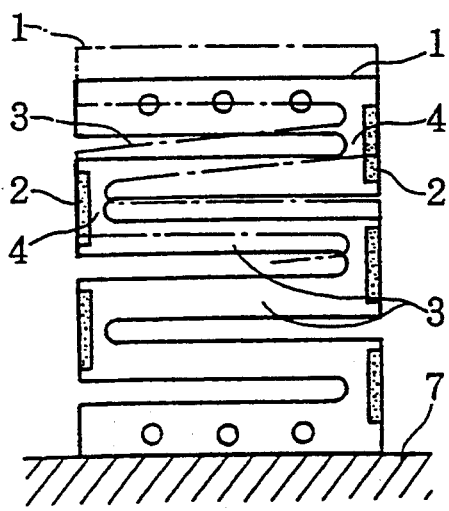
FIG. 4(A) shows an outer surface of one of the piezoelectric actuators disposed in an axially symmetrical relation relative to each other, showing an expanded condition thereof.
FIG. 4(B) shows an inner surface of the other piezoelectric actuator, showing an expanded condition thereof.
Figure 4:
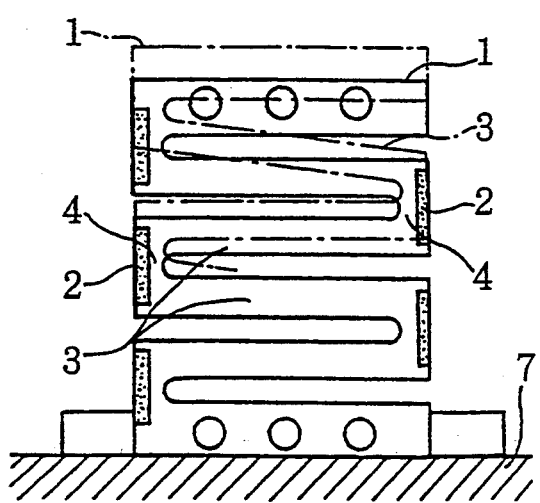
Figure 5:
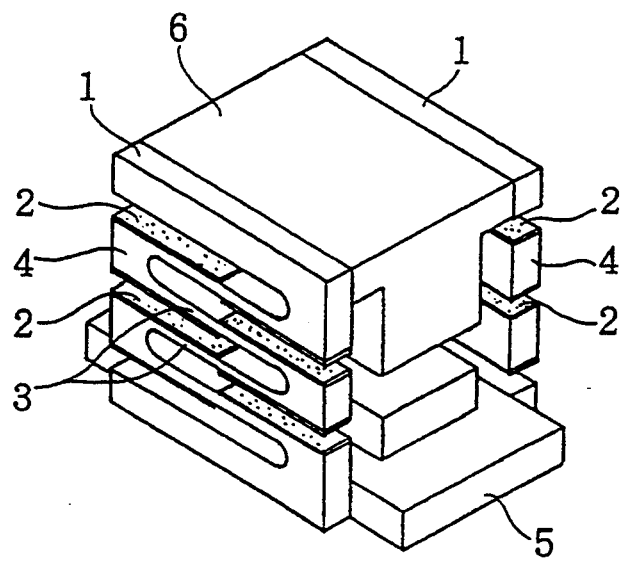
FIG. 5 is a perspective view of piezoelectric actuators according to a second embodiment of the present invention.
Figure 6:
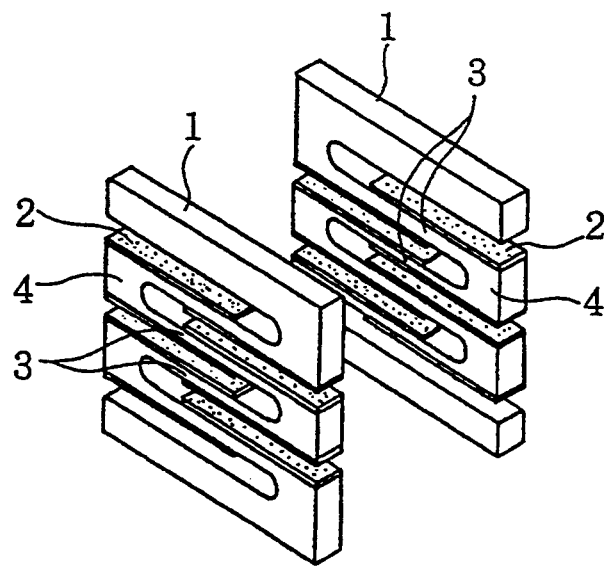
FIG. 6 is a perspective view of the piezoelectric actuators disposed in an axially symmetrical relation to each other.

Owing to the provision of the expansible piezoelectric element 2 to each outer end face of the connection section 4 as mentioned, a sort of piezoelectric bimorph structure is formed at that location. Owing to the foregoing arrangement, as shown in FIG. 3, when the expansible piezoelectric element 2 is expanded and contracted due to voltage supplied thereto, the connection section 4 is subjected to bending. The respective zigzag elements 3 are positionally shifted away from each other due to this bending. Since this positional shifting occurs for each zigzag element 3, as shown in FIG. 4, each bending action (or bend) is accumulated to cause the expansion of the whole zigzag assembly, i.e., actuator body 1, to be amplified so as to be expanded in the zigzag direction (vertical direction).

On the contrary, when the expansible piezoelectric elements 2 are expanded due to voltage supplied thereto, the respective zigzag elements 3 are positionally shifted toward each other, and as a result, the actuator body 1 is contracted in the zigzag direction (vertical direction).

In the second embodiment, opposing surfaces of the adjacent zigzag elements 3 of the zigzag assembly constituting the actuator body 1 are each provided with one of the expansible piezoelectric elements 2 integrally attached thereto.

Each expansible piezoelectric element 2 is attached to each zigzag element 3 such that one end of the piezoelectric element 2 reaches the corresponding connection section 4, and the other end reaches a generally central portion of the zigzag element 3. Although not shown, in view of the first embodiment, an arrangement is possible in which the expansible piezoelectric elements 2 are attached to rear end faces of the connecting portions 4 and the opposing surfaces of the adjacent zigzag elements 3, respectively. It may also be possible to attach the expansible piezoelectric elements 2 to the upper surface (i.e. one of the opposing surfaces of the adjacent zigzag elements 3) over substantially the entire lengths thereof.

Figure 7:
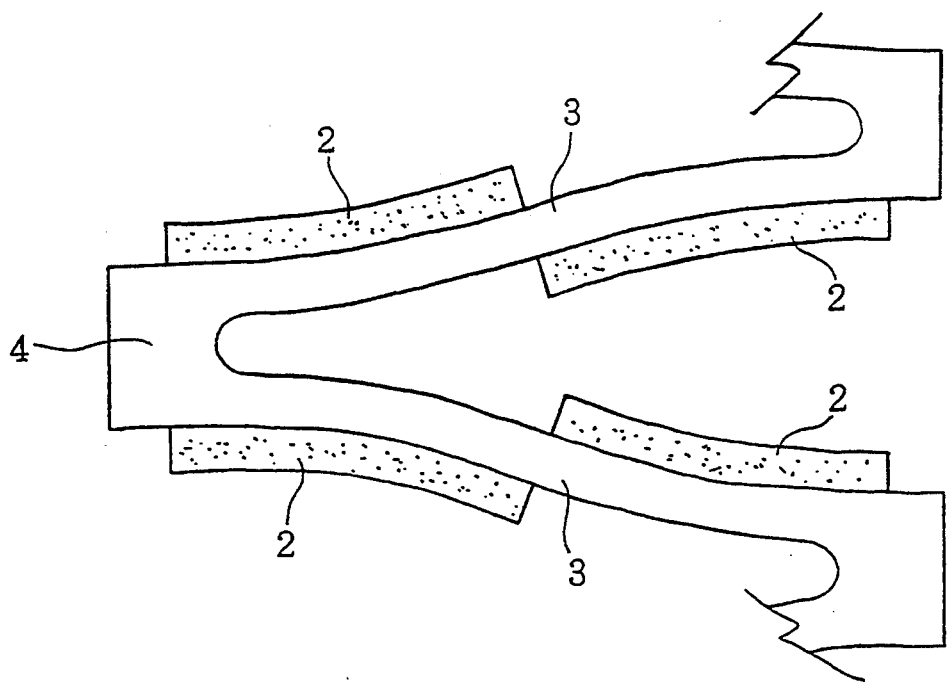
FIG. 7 is an enlarged side view showing one stage of the operation of the actuator when the expansible piezoelectric element piece is contracted in the piezoelectric actuator.

Owing to the provision of the expansible piezoelectric elements 2 attached respectively to the opposing surfaces of the adjacent zigzag elements 3 as mentioned above, a sort of piezoelectric bimorph structure is formed at that location. Owing to the foregoing arrangement, as shown in FIG. 7, when the expansible piezoelectric elements 2 are contracted by voltage supplied thereto, each zigzag element 3 is subjected to bending with the connection section 4 serving as a starting point. The respective zigzag elements 3 are positionally shifted away from each other due to this bending. Since this positional shifting occurs for each zigzag element 3, as shown by an imaginary lines of FIG. 8, the individual bends are accumulated to cause the expansion of the whole zigzag assembly, i.e., actuator body 1, to be amplified so as to be expanded in the zigzag direction (vertical direction).

On the contrary, when the expansible piezoelectric elements 2 are expanded due to voltage supplied thereto, the respective zigzag elements 3 are positionally shifted toward each other, and as a result, the actuator body 1 is contracted in the zigzag direction (vertical direction).

The actuator body 1 in the first and second embodiments is secured at one end thereof in a constant position (installing surface 7), and the other end of the actuator body 1 supports an object. As a result, the object can be moved between the expanding position and the contracting position by the above-mentioned action. Continuous operation of the above-mentioned action causes vibrations.

In the first and second embodiment, one pair of the units of the actuators are used, and the actuators are disposed side by side so as to be axially symmetrical relative to each other. First ends of the two actuator bodies 1 are rigidly connected to each other through a connecting member 5 and the opposite ends are rigidly connected to each other through a connecting member 6. The connecting member 5 is secured to the installing surface 7 as a mounting means, and the object is placed or integrally mounted on the connecting member 6 at the other end so as to be supported.

Figure 8:
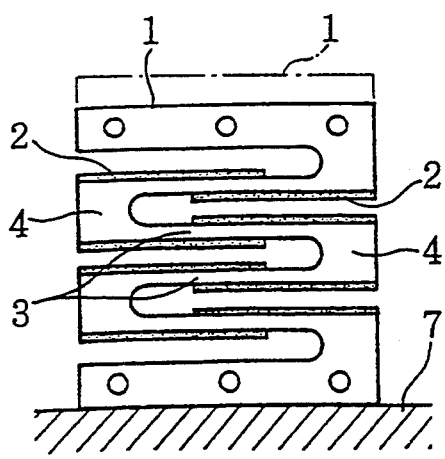
FIG. 8(A) shows an outer surface of one of the piezoelectric actuators disposed in an axially symmetrical relation.
FIG. 8(B) shows an inner surface of the other piezoelectric actuator.
Figure 8:
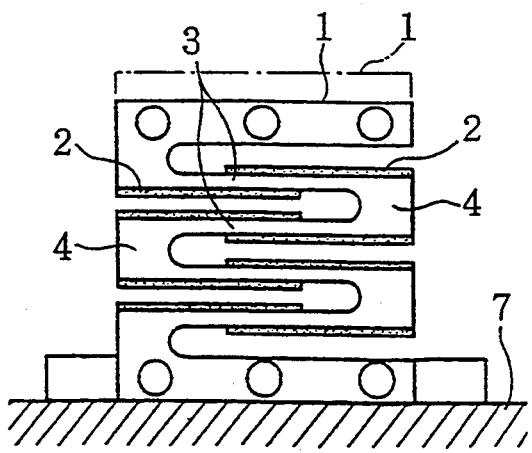

In this way, according to the above-mentioned principle of action, as shown in FIGS. 4 and 8, the two actuator bodies 1 are moved in the expanding/contracting direction of the actuators with the rigidly connected connecting member 6 held in a horizontal posture, to thereby to move the object supported thereon in the expanding/contracting direction.

Although not shown, the present invention includes an arrangement in which the two actuator bodies 1 are not rigidly connected to each other through the connecting member 6 that they remain free, and the object is supported thereon so that the object will be shifted in a horizontal direction along another guide mechanism. Similarly, the invention further includes an arrangement in which the object is pivotally supported on first ends of the two actuator bodies 1 through a shaft, or the like in such a manner as to be horizontally shifted.

As another example, an arrangement is possible in which four units of the actuators are used, and these actuators are arranged in the shape of a square or polygon so as to constitute a piezoelectric actuator.

According to the present invention, the zigzag structure of the actuator body in cooperation with the expansible piezoelectric elements attached thereto allows for a to considerably increase in the shifting amount of each zigzag element, and by accumulating the shifting amount of each zigzag element, there can be obtained a sufficiently amplified expanding/contracting amount of the whole actuator assembly.

By arranging a pair of such actuators in axially symmetrical parallel relation to each other, the object supported thereon can be horizontally moved in parallel with a sufficient amount of motion.

A wide range of objects ranging from large objects to small objects can be supported in a stable manner by installing the piezoelectric actuators in a spaced apart parallel relation, and the a predetermined expanding/contracting motion can be given thereto. Accordingly, the invention can easily cope with the physical size of the object as needed.

The present invention is not limited to the above embodiments, and various modifications can be made.

What is claimed is:

1. A piezoelectric actuator comprising a zigzag-shaped actuator body, and at least one expansible piezoelectric element attached to said actuator body, said actuator body including zigzag elements, said zigzag elements being shifted toward and away from each other by expansion/contraction of said at least one expansible piezoelectric element, said actuator body being expanded and contracted by positional shifting of the zigzag elements.

2. A piezoelectric actuator as claimed in claim 1, in which said at least one expansible piezoelectric element comprises a plurality of expansible piezoelectric elements, each of which is attached to outer end faces of adjacent ones of said zigzag elements.

3. A piezoelectric actuator as claimed in claim 1, in which said at least one expansible piezoelectric element comprises a plurality of expansible piezoelectric elements which are respectively attached to opposing surfaces of adjacent ones of said zigzag elements.

4. A piezoelectric device comprising
a pair of piezoelectric actuators, each of which has first and second ends, said actuators being axially symmetrically arranged relative to each other with said first ends of said actuators being connected to each other, each of said actuators comprising:

a zigzag-shaped actuator body, and at least one expansible piezoelectric element attached to said actuator body, said actuator body including zigzag elements, said zigzag elements being shifted toward and away from each other by expansion/contraction of said at least one expansible piezoelectric element, said actuator body being expanded and contracted by positional shifting of the zigzag elements.

5. A piezoelectric actuator comprising:

a zigzag-shaped actuator body comprising a plurality of zigzag elements connected together;

at least one expansible piezoelectric element attached to said zigzag-shaped actuator body; and wherein said at least one expansible piezoelectric element is expandable and contractible so as to constitute a means for positionally shifting said zigzag elements to cause expansion and contraction of said zigzag-shaped actuator body.

6. A piezoelectric actuator as claimed in claim 5, in which said at least one expansible piezoelectric element comprises a plurality of expansible piezoelectric elements, each of which is attached to outer end faces of adjacent ones of said zigzag elements.

7. A piezoelectric actuator as claimed in claim 5, in which said at least one expansible piezoelectric element comprises a plurality of expansible piezoelectric elements which are respectively attached to opposing surfaces of adjacent ones of said zigzag elements.

8. A piezoelectric device comprising a pair of piezoelectric actuators, each of which has first and second ends, said actuators being axially symmetrically arranged relative to each other with said first ends of said actuators being connected to each other, each of said actuators comprising:

a zigzag-shaped actuator body comprising a plurality of zigzag elements connected together;

at least one expansible piezoelectric element attached to said zigzag-shaped actuator body; and wherein said at least one expansible piezoelectric element is expandable and contractible so as to constitute a means for positionally shifting said zigzag elements to cause expansion and contraction of said zigzag-shaped actuator body.

* * * * *